(12) United States Patent
Naono et al.

(10) Patent No.: US 7,816,842 B2
(45) Date of Patent: Oct. 19, 2010

(54) PATTERNED INORGANIC FILM FORMED OF AN INORGANIC MATERIAL ON A METAL FILM HAVING A SURFACE WHICH INCLUDES A PLURALITY OF SURFACE-OXIDIZED AREAS, PIEZOELECTRIC DEVICE HAVING THE PATTERNED INORGANIC FILM, AND PROCESS FOR PRODUCING THE INORGANIC FILM

(75) Inventors: Takayuki Naono, Kanagawa-ken (JP); Takamichi Fujii, Kanagawa-ken (JP)

(73) Assignee: Fujifilm Corporation, Tokyo (JP)

( * ) Notice: Subject to any disclaimer, the term of this patent is extended or adjusted under 35 U.S.C. 154(b) by 119 days.

(21) Appl. No.: 12/054,996

(22) Filed: Mar. 25, 2008

(65) Prior Publication Data

US 2008/0248265 A1 Oct. 9, 2008

(30) Foreign Application Priority Data

Mar. 26, 2007 (JP) .............................. 2007-078254

(51) Int. Cl.
*H01L 41/187* (2006.01)
*H01L 41/16* (2006.01)

(52) U.S. Cl. ...................................... 310/358; 310/363
(58) Field of Classification Search .................. 310/328, 310/363, 364, 365
See application file for complete search history.

(56) References Cited

U.S. PATENT DOCUMENTS

| 6,156,672 | A | 12/2000 | Koshido et al. |
| 6,436,838 | B1 | 8/2002 | Ying et al. |
| 7,200,907 | B2 * | 4/2007 | Takakuwa et al. .......... 29/25.35 |
| 2004/0248047 | A1 | 12/2004 | Kato |
| 2005/0097716 | A1 * | 5/2005 | Takakuwa et al. .......... 29/25.35 |

FOREIGN PATENT DOCUMENTS

JP 53-70764 6/1978

* cited by examiner

*Primary Examiner*—J. SanMartin
(74) *Attorney, Agent, or Firm*—Birch, Stewart, Kolasch & Birch, LLP

(57) ABSTRACT

An inorganic film formed of an inorganic material on a metal film having a surface including surface-oxidized areas. The surface-oxidized areas are surface oxidized to different degrees. For example, the surface-oxidized areas are one or more lowly-surface-oxidized areas and one or more highly-surface-oxidized areas. The inorganic film includes regions which are respectively formed on the surface-oxidized areas, and the regions have different crystal structures according to the different degrees of surface oxidation. For example, a patterned inorganic film constituted by one or more protruding portions arranged on one or more lowly-surface-oxidized areas of the surface of the metal film can be produced by removing the portions of the inorganic film formed on highly-surface-oxidized areas.

7 Claims, 7 Drawing Sheets

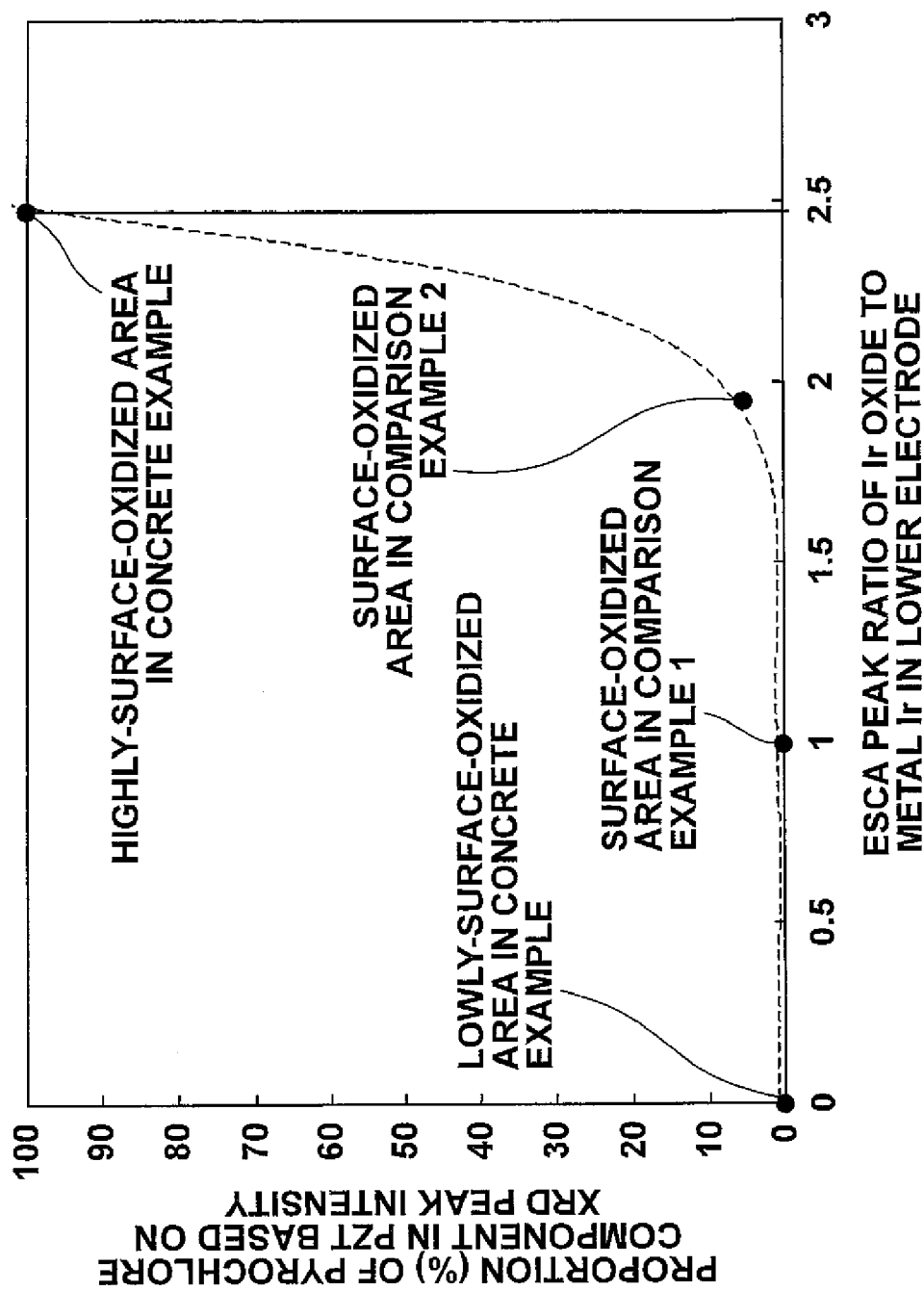

PYROCHLORE REGION

PEROVSKITE REGION

XRD PROFILE OF COMPARISON EXAMPLE 4

PATTERNED INORGANIC FILM FORMED OF AN INORGANIC MATERIAL ON A METAL FILM HAVING A SURFACE WHICH INCLUDES A PLURALITY OF SURFACE-OXIDIZED AREAS, PIEZOELECTRIC DEVICE HAVING THE PATTERNED INORGANIC FILM, AND PROCESS FOR PRODUCING THE INORGANIC FILM

BACKGROUND OF THE INVENTION

1. Field of the Invention

The present invention relates to a process for producing an inorganic film which can be patterned to produce a patterned inorganic film, and a process for producing a patterned inorganic film. The present invention also relates to an inorganic film which can be produced by using the latter process, and a patterned inorganic film which can be produced by using the former process. The present invention further relates to a piezoelectric device having a piezoelectric film produced by using the former process, and a liquid discharge device using the piezoelectric film.

2. Description of the Related Art

Currently, piezoelectric devices constituted by a piezoelectric film and electrodes are used, for example, as actuators installed in inkjet recording heads, and the like. In the piezoelectric devices, the piezoelectric film expands and contracts in correspondence with increase and decrease in the strength of an electric field which is applied from the electrodes to the piezoelectric film along a predetermined direction. The perovskite oxides such as PZT (lead titanate zirconate) are known as materials suitable for the piezoelectric film.

It is known that in uncontinuous piezoelectric films each of which is patterned so as to form a plurality of separate protruding portions, the separate protruding portions can smoothly expand and contract, and therefore great displacement can be achieved. In order to achieve desired displacement, the piezoelectric films are formed, for example, with thicknesses of 1 to 5 micrometers. The thicknesses of the piezoelectric films are greater than the thicknesses of the electrodes, which are on the order of nanometers (e.g., 200 nm). As disclosed in U.S. Pat. No. 6,436,838. Conventionally, the patterning of piezoelectric films of PZT or the like is generally performed by dry etching.

The dry etching is generally known as anisotropic etching. However, PZT and the like are uneasy to etch, and the piezoelectric films are thicker than the electrodes (the thicknesses of which are on the order of nanometers). Therefore, the piezoelectric films are more difficult to etch than the electrodes and the like, so that there is a tendency that patterning of the piezoelectric films takes much time. In addition, the dry etching cannot achieve completely anisotropic processing, so that the protruding portions have tapered shapes. Thus, there is a tendency that highly precise etching is difficult.

In order to improve the quality of images produced by the inkjet recording heads, demands for higher uniformness in the piezoelectric performance of the protruding portions constituting a piezoelectric film used in each inkjet recording head are increasing. However, it is difficult to equalize the taper angles of the side faces of the protruding portions by the dry etching, which produces tapered shapes of the protruding portions. Therefore, the influence, on the image quality, of variations in the piezoelectric performance which are caused by variations in the shapes of the protruding portions can become unignorable in the future. In consideration of the precision in the shapes of the side faces of the protruding portions, it is preferable to use a patterning technique which can stably produce approximately vertical side faces of the protruding portions.

In addition, the lift-off technique is known as a technique for patterning an inorganic film such as an electrode and a dielectric film, as indicated in Japanese Unexamined Patent Publication No. 53 (1978)-070764, U.S. Pat. No. 6,156,672, and U.S. Patent Application Publication No. 20040248047. According to the lift-off technique, removable resist is selectively deposited on areas of a substrate on which an inorganic film is not to be formed in accordance with a predetermined pattern. Then, a solid (gapless) inorganic film is formed over the substrate on which the above removable resist is selectively formed. Finally, the resist is removed together with the portions of the inorganic film located on the resist, so that the other portions of the inorganic film in the predetermined pattern are left.

However, since the inorganic film is formed on the resist according to the lift-off technique, it is impossible to form the inorganic film above the heat-resistance temperature. The inorganic films are reported to be formed at 150° C. or lower by Japanese Unexamined Patent Publication No. 53 (1978)-070764 and U.S. Pat. No. 6,156,672, and at 250° C. or lower by U.S. Patent Application Publication No. 20040248047. In order to achieve satisfactory growth of a perovskite structure in a piezoelectric film of a perovskite oxide such as PZT, the film-formation temperature of 350° C. or higher (preferably, 400° C. or higher) is necessary. Therefore, it is impossible to use the lift-off technique (which uses resist) for formation of the piezoelectric film.

The lift-off technique can realize precise patterning of a thin film such as an electrode having a thickness on the order of nanometers and formation of approximately vertical side faces of protruding portions. However, when the lift-off technique is used in patterning of a piezoelectric film, which has a great thickness on the order of micrometers, the great thickness of the piezoelectric film located on the resist makes the removal of the resist and the unnecessary portions of the piezoelectric film difficult. In addition, since the unnecessary portions of the piezoelectric film, which is originally formed in a continuous single piece, are torn from the necessary portions of the piezoelectric film for the removal, it is difficult to form the pattern with satisfactorily precise shapes.

SUMMARY OF THE INVENTION

The present invention has been made in view of the above circumstances.

The first object of the present invention is to provide a process which is provided for producing an inorganic film which can be easily and precisely patterned at low cost, and is particularly effective in the case where the inorganic film is made of a material difficult to pattern (such as the piezoelectric material).

The second object of the present invention is to provide a process which enables easy and precise production of a patterned inorganic film at low cost, and is particularly effective in the case where the patterned inorganic film is made of a material difficult to pattern (such as the piezoelectric material).

The third object of the present invention is to provide an inorganic film which can be easily and precisely patterned at low cost even in the case where the inorganic film is made of a material difficult to pattern (such as the piezoelectric material).

The fourth object of the present invention is to provide a patterned inorganic film which can be easily and precisely produced at low cost even in the case where the patterned inorganic film is made of a material difficult to pattern (such as the piezoelectric material).

The fifth object of the present invention is to provide a piezoelectric device produced by using the above patterned inorganic film.

The sixth object of the present invention is to provide a liquid discharge device using the above patterned inorganic film.

(I) In order to accomplish the first object, according to the first aspect of the present invention, a process producing an inorganic film of an inorganic material constituted by a plurality of portions having different crystal structures is provided. The process comprises the steps of: (a) forming a metal film which has a surface including a plurality of areas which are surface oxidized to different degrees; and (b) forming a solid (gapless) inorganic film of the inorganic material on the metal film.

In this specification, the expression "a plurality of areas are surface oxidized to different degrees" means that the plurality of areas are surface oxidized so as to exhibit different values of the peak area ratio of oxidized metal to unoxidized metal in spectra obtained by ESCA (Electron Spectroscopy for Chemical Analysis) of the surface of the metal film, and one of the different degrees of the surface oxidation may correspond to the unoxidized surface. When a metal is oxidized, a peak of a specific electron orbit of the metal observed by ESCA is shifted by the oxidation. Therefore, the peaks area ratio of oxidized metal to unoxidized metal is defined as the ratio of the total area of one or more peaks of a specific electron orbit of a specific metal which are shifted by oxidation to the total area of one or more peaks of the specific electron orbit of the specific metal which are not shifted by oxidation. When the specific electron orbit is separated into a plurality of states, a plurality of split peaks can be observed on the basis of the total area of the plurality of split peaks.

In addition, the expression "a plurality of portions having different crystal structures" means that the plurality of portions exhibit different XRD (X-ray diffraction) profiles. Further, the term "solid" means that the solid inorganic film formed in step (b) has no gaps or breaks.

The process according to the first aspect of the present invention can produce an inorganic film from which one or more portions of the inorganic film can be easily and selectively removed by use of the difference in the crystal structure.

In order to accomplish the second object, a process according to the second aspect of the present invention is provided. The process according to the second aspect of the present invention includes the process according to the first aspect of the present invention and further has the following features. In the process according to the second aspect of the present invention, the plurality of areas which are surface oxidized to different degrees in step (a) are one or more lowly-surface-oxidized areas and one or more highly-surface-oxidized areas which are more highly surface oxidized than the one or more lowly-surface-oxidized areas, and the process according to the second aspect of the present invention further comprises an additional step (c) of removing portions of the solid inorganic film which are formed on the one or more highly-oxidized areas so as to leave a patterned inorganic film having one or more protruding portions in a predetermined pattern. In other words, the process according to the first aspect of the present invention constitutes a part (the first step (a) and intermediate step (b)) of the process according to the second aspect of the present invention under the condition that the plurality of areas which are surface oxidized to different degrees in step (a) are one or more lowly-surface-oxidized areas and one or more highly-surface-oxidized areas which are more highly surface oxidized than the one or more lowly-surface-oxidized areas.

In this specification, the highly-surface-oxidized areas are assumed to be the areas at which the values of the peak area ratio of oxidized metal to unoxidized metal in spectra obtained by ESCA of the surface of the metal film are greater than 2.0, and the lowly-surface-oxidized areas are assumed to be the areas at which the values of the peak area ratio of oxidized metal to unoxidized metal in spectra obtained by ESCA of the surface of the metal film are equal to or smaller than 2.0. The lowly-surface-oxidized areas may be unoxidized areas.

Since the portions of the solid inorganic film which are formed on the one or more highly-oxidized areas have a different crystal structure from the portions of the solid inorganic film which are formed on the one or more lowly-oxidized areas, it is easy to selectively remove the portions of the solid inorganic film which are formed on the one or more highly-oxidized areas. Since the portions of the solid inorganic film which are formed on the one or more highly-oxidized areas from the portions of the solid inorganic film which are formed on the one or more lowly-oxidized areas can be easily separated at the boundaries between the portions of the solid inorganic film which are formed on the one or more highly-oxidized areas and the portions of the solid inorganic film which are formed on the one or more lowly-oxidized areas, it is possible to selectively and precisely leave only the portions of the solid inorganic film which are formed on the one or more lowly-oxidized areas (as the one or more protruding portions). Further, according to the process according to the second aspect of the present invention, it is possible to make the side faces of the protruding portions approximately perpendicular to the surface of the metal film.

The processes according to the first and second aspects of the present invention are effective in patterning of an inorganic film such as a piezoelectric film which is difficult to pattern. The process according to the second aspect of the present invention can precisely and easily produce a desired pattern at low cost.

Preferably, the process according to the second aspect of the present invention may further have one or any possible combination of the following additional features (i) and (ii).

(i) The step (a) includes the substeps of (a1) forming an unoxidized metal film, and (a2) selectively oxidizing areas of the surface of the non-oxidized metal film on which the one or more protruding portions are not to be formed.

(ii) In the step (b), the solid inorganic film has a columnar-grain structure constituted by a plurality of columnar grains each extending nonparallel to the surface of the metal film.

(II) In order to accomplish the third object, an inorganic film according to the third aspect of the present invention is provided. The inorganic film according to the third aspect of the present invention is formed of an inorganic material on a metal film which has a surface including a plurality of surface-oxidized areas, where the plurality of surface-oxidized areas are surface oxidized to different degrees, the inorganic film has a plurality of regions respectively formed on the plurality of surface-oxidized areas, and the plurality of regions have different crystal structures according to the different degrees of the surface oxidation.

The inorganic film according to the third aspect of the present invention can be produced by the process according to the first aspect of the present invention. Conversely, the inorganic film produced by the process according to the first aspect of the present invention is an aspect of the present invention which achieves the third object of the present invention.

Since the plurality of regions of the solid inorganic film have different crystal structures according to the different degrees of the surface oxidation of the plurality of surface-oxidized areas of the metal film underlying the solid inorganic film, selective removal of part of the plurality of regions by use of the difference in the crystal structures is facilitated.

Preferably, the inorganic film according to the third aspect of the present invention may further have one or any possible combination of the following additional features (iii) to (vi).

(iii) The plurality of surface-oxidized areas are one or more lowly-surface-oxidized areas and one or more highly-surface-oxidized areas which are more highly surface oxidized than the one or more lowly-surface-oxidized areas, the inorganic material is a piezoelectric material, one or more of the plurality of regions which are formed on the one or more lowly-surface-oxidized areas have a perovskite structure, and one or more of the plurality of regions which are formed on the one or more lowly-surface-oxidized areas contain a pyrochlore phase.

The third aspect of the present invention can be preferably applied to the piezoelectric film. In the case where a piezoelectric film is formed on the metal film the surface of which includes one or more lowly-surface-oxidized areas and one or more highly-surface-oxidized areas, it is possible to form such a piezoelectric film that the portions of the piezoelectric film formed on the one or more lowly-surface-oxidized areas have a perovskite structure, and the portions of the piezoelectric film formed on the one or more highly-surface-oxidized areas contain a pyrochlore phase.

(iv) The piezoelectric material contains a lead-containing compound. In this case, it is particularly easy to form the piezoelectric film having the plurality of regions which have different crystal structures.

(v) The metal film contains noble metal as a main component.

In this specification, the term "main component" means a component the content of which is 90 weight percent or higher.

(vi) The inorganic film according to the inorganic film according to the third aspect of the present invention has a columnar-grain structure constituted by a plurality of columnar grains each extending nonparallel to the surface.

In addition, in order to accomplish the fourth object, a patterned inorganic film according to the fourth aspect of the present invention is provided. The patterned inorganic film according to the fourth aspect of the present invention patterned inorganic film is constituted by one or more protruding portions of an inorganic material arranged in a predetermined pattern on one or more lowly-surface-oxidized areas of a surface of a metal film, where the surface of the metal film includes the one or more lowly-surface-oxidized areas and one or more highly-surface-oxidized areas which are more highly surface oxidized than the one or more lowly-surface-oxidized areas.

The inorganic film according to the fourth aspect of the present invention can be produced by the process according to the second aspect of the present invention. That is, the patterned inorganic film according to the fourth aspect of the present invention can be produced by forming a solid inorganic film on the above metal film, and removing one or more portions of the solid inorganic film which are formed on the one or more highly-surface-oxidized areas.

Conversely, the patterned inorganic film produced by the process according to the second aspect of the present invention is an aspect of the present invention which achieves the fourth object of the present invention.

The patterned inorganic film according to the fourth aspect of the present invention can be precisely and easily produced at low cost.

Preferably, the patterned inorganic film according to the fourth aspect of the present invention may further have one or any possible combination of the following additional features (vii) to (ix) and the aforementioned additional features (v) and (vi).

(vii) The protruding portions have side faces which are approximately perpendicular to the surface.

In this specification, the expression "approximately perpendicular to the surface" means that the angle formed with the surface is 90±10 degrees.

(viii) The patterned inorganic film according to the fourth aspect of the present invention is a patterned piezoelectric film having a perovskite structure.

The fourth aspect of the present invention can also be preferably applied to the piezoelectric film. As mentioned before for the third aspect of the present invention, in the case where a piezoelectric film is formed on the metal film the surface of which includes one or more lowly-surface-oxidized areas and one or more highly-surface-oxidized areas, it is possible to form such a piezoelectric film that the portions of the piezoelectric film formed on the one or more lowly-surface-oxidized areas have a perovskite structure, and the portions of the piezoelectric film formed on the one or more highly-surface-oxidized areas contain a pyrochlore phase. The material having the pyrochlore structure contains many microcracks and is fragile, so that selective removal of the portions containing the pyrochlore phase is easy. The proportion of the pyrochlore component in the portions of the piezoelectric film formed on the one or more highly-surface-oxidized areas is not specifically limited. Although the removability depends on the composition, it is easy to selectively remove the portions of the piezoelectric film formed on the one or more highly-surface-oxidized areas when the proportion of the pyrochlore component in the portions is 50% or higher.

(ix) The patterned inorganic film according to the fourth aspect of the present invention is a patterned piezoelectric film which contains a lead-containing compound. In this case, it is particularly easy to form the patterned piezoelectric film having the protruding portions formed on only the one or more lowly-surface-oxidized areas.

(III) In order to accomplish the fifth object, according to the fifth aspect of the present invention, a piezoelectric device which uses the patterned inorganic film according to the fourth aspect of the present invention having the aforementioned additional feature (viii) or (ix) is provided.

(IV) In order to accomplish the sixth object, a liquid discharge device according to the sixth aspect of the present invention is provided. The liquid discharge device according to the sixth aspect of the present invention comprises: the piezoelectric device according to the fifth aspect of the present invention; and a discharge member including a liquid-reserve chamber which reserves liquid, and a liquid-discharge outlet through which the liquid is externally discharged from the liquid-reserve chamber.

DESCRIPTION OF THE DRAWINGS

FIG. 7 is a diagram indicating a relationship between the ESCA peak area ratio of an oxide of iridium to metal iridium in a lower electrode and the ratio of the XRD peak intensity of the pyrochlore component to the sum of the XRD peak intensities of the pyrochlore and perovskite components in PZT grown on the lower electrode (i.e., the proportion of the pyrochlore component in PZT grown on the lower electrode based on the XRD peak intensities of the pyrochlore and perovskite components).

DESCRIPTION OF PREFERRED EMBODIMENTS

Preferred embodiments of the present invention are explained in detail below with reference to drawings.

1. Piezoelectric Device and Inkjet Recording Head

Figure 1:
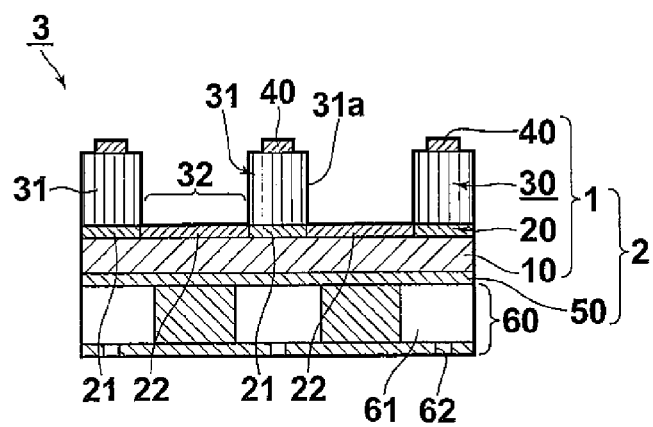
FIG. 1 is a cross-sectional view schematically illustrating a cross section of an essential portion of an inkjet recording head (as a liquid discharge device) having a piezoelectric device according to an embodiment of the present invention.

Hereinbelow, the structure of an inkjet recording head (as an embodiment of the liquid discharge device according to the sixth aspect of the present invention) containing a piezoelectric device (as an embodiment of the piezoelectric device according to the fifth aspect of the present invention) is explained with reference to FIG. 1, which is a cross-sectional view schematically illustrating a cross section (in the thickness direction) of an essential portion of the inkjet recording head. In FIG. 1, the dimensions of the illustrated elements are differentiated from the dimensions of the elements of the actual inkjet recording head for clarification.

In outline, the inkjet recording head 3 illustrated in FIG. 1 is constituted by a piezoelectric actuator 2 and an ink-nozzle member 60, and the piezoelectric actuator 2 is constituted by a piezoelectric device 1 and a diaphragm 50.

The piezoelectric device 1 is produced by forming on a substrate 10 a lower electrode 20, a piezoelectric film 30, and upper electrodes 40 in this order so that an electric field in the thickness direction can be applied to each portion (corresponding to a pixel or an ink chamber) of the piezoelectric film 30 through the lower electrode 20 and the upper electrodes 40.

The lower electrode 20 is formed over approximately the entire (upper) surface of the substrate 10. The piezoelectric film 30 formed on the lower electrode 20 is patterned into one or more protruding portions 31 in a stripelike arrangement, where each of the one or more protruding portions 31 has a linear shape. The upper electrodes 40 are respectively formed on the one or more protruding portions 31. However, the pattern of the piezoelectric film 30 is not limited to the above arrangement, and other patterns may be used according to necessity.

The piezoelectric actuator 2 is produced by attaching the diaphragm 50 to the back surface of the substrate 10 of the piezoelectric device 1 so that the diaphragm 50 can vibrate in correspondence with expansion and contraction of the piezoelectric film 30.

The inkjet recording head 3 is produced by attaching the ink-nozzle member 60 to the back surface of the piezoelectric actuator 2. The ink-nozzle member 60 is a member for reserving and discharging ink, and comprises ink chambers 61 (as the liquid-reserve chambers) and ink-discharge outlets 62 (as the liquid-discharge outlets). Each of the ink chambers 61 is connected to the corresponding one of the ink chambers 61. Each of the ink chambers 61 reserves the ink, and the ink held in the ink chamber is discharged out of the ink chamber through the corresponding ink-discharge outlet. The ink chambers 61 are arranged in correspondence with the one or more protruding portions 31 of the piezoelectric film 30.

Alternatively, it is possible to process portions of the substrate 10 into the diaphragm 50 and the ink-nozzle member 60, instead of separately preparing the diaphragm 50 and the ink-nozzle member 60 and attaching the diaphragm 50 and the ink-nozzle member 60 to the piezoelectric device 1. For example, the ink chambers 61 can be formed by etching the corresponding portions of the substrate 10 from the bottom surface of the substrate 10, and the diaphragm 50 and the structures of the ink-nozzle member 60 can be produced by processing the substrate 10 per se.

In the above inkjet recording head 3, the strength of the electric field applied to each portion (corresponding to a pixel or an ink chamber) of the piezoelectric device 1 is increased or decreased so as to expand or contract each portion of the piezoelectric device 1 and control the discharge of the ink from the corresponding one of the ink chambers 61 and the discharge amount of the ink.

The material (composition) of the substrate 10 is not specifically limited. For example, the substrate 10 may be made of silicon, glass, stainless steel, YSZ (yttrium stabilized zirconia), alumina, sapphire, silicon carbide, or the like. In addition, the substrate 10 may be realized by a laminated substrate such as the SOI (silicon-on-insulator) substrate, which is produced by alternately forming on a surface of a silicon substrate one or more oxide films of $SiO_2$ and one or more Si active layers.

In this embodiment, the surface of the lower electrode 20 includes one or more lowly-surface-oxidized areas (first surface-oxidized areas) 21 and one or more highly-surface-oxidized areas (second surface-oxidized areas) 22. The one or more lowly-surface-oxidized areas 21 and the one or more highly-surface-oxidized areas 22 are arranged in correspondence with the arrangement of the one or more protruding portions 31. Specifically, the one or more lowly-surface-oxidized areas 21 are the areas on which the one or more protruding portions 31 are to be formed, and the one or more highly-surface-oxidized areas 22 are the areas on which the one or more protruding portions 31 are not to be formed.

The main component of the lower electrode 20 is not specifically limited, and may be, for example, one of or an alloy of noble metals such as Au, Pt, and Ir. For example, the one or more lowly-surface-oxidized areas 21 may be non-oxidized areas. In this case, the one or more lowly-surface-oxidized areas 21 and the one or more highly-surface-oxidized areas 22 can be realized by forming a solid (gapless) electrode of a noble metal, and selectively surface oxidizing the areas on which the one or more protruding portions 31 are not to be formed.

The main component of the upper electrodes 40 is not specifically limited, and may be, for example, one or a combination of metals such as Au, Pt, and Ir, metal oxides such as $IrO_2$, $RuO_2$, $LaNiO_3$, and $SrRuO_3$, and the materials which are generally used for electrodes in the semiconductor processes, such as Al, Ta, Cr, and Cu.

The piezoelectric film 30 can be formed by forming a solid (gapless) piezoelectric film on the lower electrode 20 having the one or more lowly-surface-oxidized areas 21 and the one or more highly-surface-oxidized areas 22, and removing the portions of the solid piezoelectric film located on the one or more highly-surface-oxidized areas 22.

It is preferable that the piezoelectric film 30 be basically formed of material having a perovskite structure, e.g., one or more perovskite oxides, although the piezoelectric film 30 may contain inevitable impurities. It is further preferable that the piezoelectric film 30 be basically formed of one or more perovskite oxides having the composition expressed by the compositional formula,

$$ABO_3, \tag{P}$$

where A represents one or more A-site elements, B represents one or more B-site elements, and C represents oxygen atoms. The one or more A-site elements are one or more of the elements Pb, Ba, La, Sr, Bi, Li, Na, Ca, Cd, Mg, and K, and the one or more B-site elements are one or more of the lanthanide series of elements and the elements of Ti, Zr, V, Nb, Ta, Cr, Mo, W, Mn, Sc, Co, Cu, In, Sn, Ga, Zn, Cd, Fe, and Ni. Although the ratio of each of the total molar amount of the one or more A-site elements and the total molar amount of the B-site elements constituting the material of the piezoelectric film 30 to the molar amount of the oxygen atoms is normally 1:3, the ratio of each of the total molar amount of the one or more A-site elements and the total molar amount of the B-site elements constituting the material of the piezoelectric film 30 to the molar amount of the oxygen atoms may deviate from 1:3 within a range in which the composition expressed by the compositional formula $ABO_3$ can form a perovskite structure.

Specifically, the one or more perovskite oxides constituting the piezoelectric film 30 may be one or a mixed crystal of one or more of:

(1) lead-containing compounds such as lead titanate, lead titanate zirconate (PZT), lead zirconate, lead lanthanum titanate, lead lanthanum titanate zirconate, zirconium magnesium niobate-lead titanate, zirconium nickel niobate-lead titanate, and the like; and (2) nonlead compounds such as barium titanate, barium strontium titanate, bismuth sodium titanate, bismuth potassium titanate, sodium niobate, potassium niobate, lithium niobate, and the like.

Although the thickness of the piezoelectric film 30 (i.e., the height of the protruding portions 31) is not specifically limited, the thickness of the piezoelectric film 30 is normally 1 micrometer or greater, and is, for example, 1 to 5 micrometers. That is, the thickness of the piezoelectric film 30 is greater than the thicknesses of the lower and upper electrodes 20 and 40, which are on the order of nanometers, for example, 200 nm.

As explained in detail later, when the piezoelectric film 30 is formed of material containing a lead-containing compound such as a PZT-based material, the patterned piezoelectric film 30 can be readily formed on only the one or more lowly-surface-oxidized areas 21 of the lower electrode 20. Therefore, it is preferable that the piezoelectric film 30 be formed of material containing a lead-containing compound such as a PZT-based material.

In addition, when the piezoelectric film 30 is a columnar-structured film constituted by a great number of columnar grains which extend nonparallel to the surface of the lower electrode 20, it is easy to pattern the piezoelectric film 30 so that the piezoelectric film 30 is arranged on only the one or more lowly-surface-oxidized areas 21. Therefore, it is preferable that the piezoelectric film 30 be a columnar-structured film constituted by a great number of columnar grains which extend nonparallel to the surface of the lower electrode 20.

Further, when the piezoelectric film 30 is formed of crystalline material, it is easy to form the columnar-structured film constituted by a great number of columnar grains. Therefore, it is preferable that the piezoelectric film 30 be formed of crystalline material. However, the piezoelectric film 30 may be formed of amorphous material as long as the piezoelectric film 30 can be constituted by a great number of columnar grains.

Although there is no limitation to the average diameter of the great number of columnar grains, the average diameter is preferably 30 nanometers to 1 micrometer. When the average diameter of the columnar grains is too small, there is a possibility that crystal growth becomes insufficient to form the piezoelectric film 30, or the piezoelectric film 30 cannot exhibit desired piezoelectric performance. On the other hand, when the average diameter of the columnar grains is too great, there is a possibility that the precision in the patterning decreases.

According to the present embodiment, the piezoelectric film 30 can be formed so that the side faces 31a of the one or more protruding portions 31 are constituted by boundary faces of part of the columnar grains. In addition, it is possible to arrange the side faces 31a of the one or more protruding portions 31 approximately perpendicular to (at the angles of 90±10 degrees with respect to) the surface of the lower electrode 20.

It is known that researches on the categories of columnar grains and the relationships between the film-formation conditions (including the substrate temperature and the film-formation pressure) and the shapes and diameters of the columnar grains constituting inorganic films have been made. For example, B. A. Movchan et al., "Study of the structure and properties of thick vacuum condensates of nickel, titanium, tungsten, aluminum oxide, and zirconium oxide," Physics of Metals and Metallography (USSR), Vol. 28 (1969), p. 83 report details of results of investigations of evaporated films. In the case where the piezoelectric film 30 is an evaporated film, it is preferable that the columnar grains in the piezoelectric film 30 correspond to the Zone 2 according to the categorization indicated in the Movchan reference.

In addition, J. A. Thornton, "Influence of apparatus geometry and deposition conditions on the structure and topography of thick sputtered coatings," Journal of Vacuum Science Technology, Vol. 11(4) (1974) pp. 666-670 reports details of results of an investigation of sputtered films. In the case where the piezoelectric film 30 is a sputtered film, it is preferable that the columnar grains in the piezoelectric film 30 correspond to the Zone T through Zone II according to the categorization indicated in the Thornton reference.

2. Process for Producing Piezoelectric Device and Inkjet Recording Head

Hereinbelow, an example of a process for producing the piezoelectric device 1 and the inkjet recording head 3 is explained with reference to FIGS. 2A, 2B, 2C, 2D, 27, and 2F, which are cross-sectional views of the structures in respective stages in a process for producing the inkjet recording head of FIG. 1.

2.1 First Step

Figure 2A:
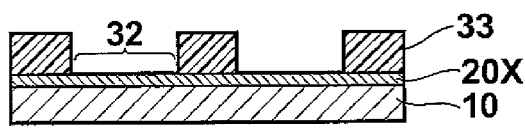
FIGS. 2A, 2B, 2C, 2D, 2E, and 2F are cross-sectional views of the structures in respective stages in a process for producing the inkjet recording head of FIG. 1.

In the first step of the process, a solid film 20X of an unoxidized metal as the lower electrode 20 is formed on approximately the entire upper surface of the substrate 10, as illustrated in FIG. 2A. The main component of the solid film 20X is preferably a noble metal or an alloy of noble metals such as Au, Pt, and Ir.

2.2 Second Step

In the second step of the process, a pattern of resist 33 corresponding to the pattern of the piezoelectric film 30 is formed on the solid film 20X by photolithography so that the resist 33 is left on the areas on which the one or more protruding portions 31 are to be formed, as illustrated in FIG. 2A.

2.3 Third Step

Figure 2B:
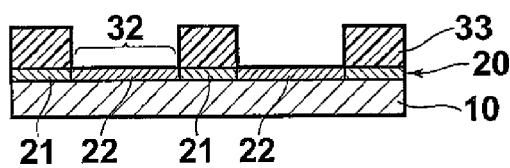

In the third step of the process, as illustrated in FIG. 2B, processing for selectively surface oxidizing the one or more areas 32 of the solid film 20X on which the one or more protruding portions 31 are not to be formed is performed by using the resist 33 as a mask. The manner of the surface oxidation is not specifically limited, and may be, for example, oxygen plasma ashing, ozone processing, or the like. The surface oxidation processing of the one or more areas 32 (of the solid film 20X on which the one or more protruding portions 31 are not to be formed) is performed so that the peak area ratio of oxidized metal to unoxidized metal in a spectrum obtained by ESCA of the one or more areas 32 exceeds 2.0.

2.4 Fourth Step

Figure 2C:
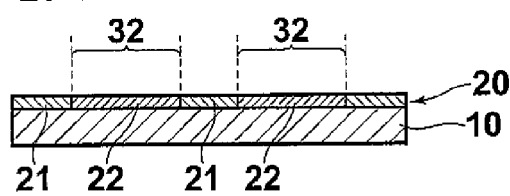

In the fourth step of the process, as illustrated in FIG. 2C, the resist 33 is removed. Thus, the lower electrode 20 the surface of which includes the one or more lowly-surface-oxidized areas 21 (which are surface oxidized to a first degree) and the one or more highly-surface-oxidized areas 22 (which are surface oxidized to a second degree) is realized. Specifically, in this example, the one or more lowly-surface-oxidized areas 21 are not surface oxidized, and the one or more highly-surface-oxidized areas 22 are surface oxidized.

2.5 Fifth Step

Figure 2D:
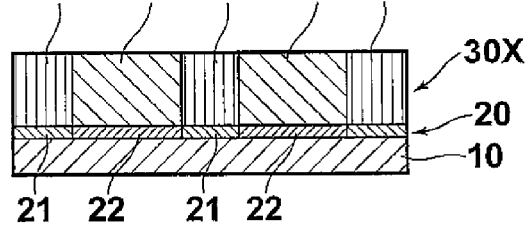

In the fifth step of the process, as illustrated in FIG. 2D, a solid (gapless) piezoelectric film 30X is formed on the lower electrode 20. At this time, it is preferable that the solid piezoelectric film 30X be a columnar-structured film constituted by a great number of columnar grains which extend nonparallel to the surface of the lower electrode 20. Further preferably, the great number of columnar grains extend approximately perpendicular to the surface of the lower electrode 20. The preferable thickness of the solid piezoelectric film 30X is normally 1 micrometer or greater, and is, for example, 1 to 5 micrometers. The preferable average diameter of the columnar grains constituting the piezoelectric film 30 is, for example, 30 nanometers to 1 micrometer.

The manner of the formation of the solid piezoelectric film 30X is not specifically limited, and it is preferable to use vapor phase epitaxy such as sputtering or chemical vapor deposition (CVD). It is possible to grow the columnar grains having a desired average diameter along a desired direction by appropriately adjusting the film-formation conditions including the film-formation temperature, the pressure, and the like according to the material (composition) of the solid piezoelectric film 30X.

When the solid piezoelectric film 30X is formed on the lower electrode 20, and the surface of the lower electrode 20 includes the one or more lowly-surface-oxidized (unoxidized) areas 21 and the one or more highly-surface-oxidized (artificially surface-oxidized) areas 22, the portions of the solid piezoelectric film 30X formed on the one or more lowly-surface-oxidized areas 21 have a different crystal structure from the portions of the solid piezoelectric film 30X formed on the one or more highly-surface-oxidized areas 22. Specifically, crystal portions 34 having a high-quality perovskite crystal structure can be grown on the one or more lowly-surface-oxidized areas 21, and portions 35 containing a pyrochlore phase (a pyrochlore structure) can be grown on the one or more highly-surface-oxidized areas 22, as illustrated in FIG. 2D.

In particular, in the case where the solid piezoelectric film 30X contains a lead-containing compound, it is easier to form the pyrochlore structure on the one or more highly-surface-oxidized areas 22. It is considered that the Pb ions in the solid piezoelectric film 30X are highly reactive with the oxygen atoms in the one or more highly-surface-oxidized areas 22 underlying the solid piezoelectric film 30X, so that PbO is produced and Pb defects are likely to occur.

The film-formation temperature of the solid piezoelectric film 30X is not specifically limited, and is set at such a level that a columnar-grain structure constituted by a great number of columnar grains can be stably formed, and the perovskite crystal structure can be stably grown on the one or more lowly-surface-oxidized areas 21. In the case where the solid piezoelectric film 30X is formed of a PZT-based material, the film-formation temperature is preferably 350° C. or higher, and more preferably 450° C. or higher. In the case where the solid piezoelectric film 30X contains a lead-containing material such as the PZT-based material, the film-formation temperature is preferably below 600° C., since lead is likely to be lost at the film-formation temperature of 600° C. or higher.

When the solid piezoelectric film 30X formed on the lower electrode 20 has a columnar-grain structure constituted by a great number of columnar grains grown approximately perpendicular to the surface of the lower electrode 20, it is possible to grow, for example, a (100)-oriented perovskite crystal structure.

Figure 8:
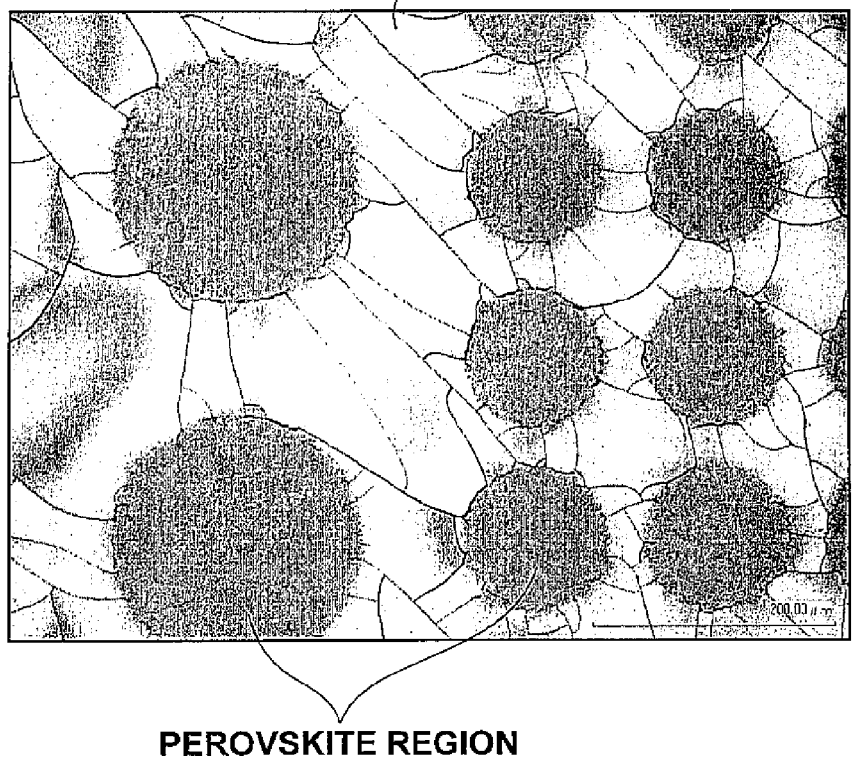
FIG. 8 is an optical micrograph of a surface of the piezoelectric film in the concrete example before patterning.

The present inventors have found that the portions 35 of the solid piezoelectric film 30X being formed on the one or more highly-surface-oxidized areas 22 and containing the pyrochlore phase have a number of microcracks and are therefore fragile, as shown in the optical micrograph of FIG. 8. The present inventors consider that the stress imposed from the substrate due to the difference in thermal expansion coefficient from the substrate, the stress imposed by the portions 34 of the solid piezoelectric film 30X having the perovskite structure, and the like produce the microcracks and make the portions 35 fragile.

2.6 Sixth Step

Figure 2E:
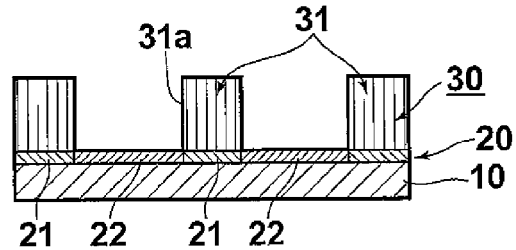

In the sixth step of the process, the portions 35 of the solid piezoelectric film 30X being formed on the one or more highly-surface-oxidized areas 22 and containing the pyrochlore phase are selectively removed as illustrated in FIG. 2E. In this step, it is possible to separate the solid piezoelectric film 30X into the portions 35 of the solid piezoelectric film 30X located on the one or more highly-surface-oxidized areas 22 and the portions 34 of the solid piezoelectric film 30X located on the one or more lowly-surface-oxidized areas 21 (at the boundaries between the portions 35 and the portions 34), and selectively and precisely leave only the portions 34 of the solid piezoelectric film 30X located on the one or more lowly-surface-oxidized areas 21 so that the portions 34 of the solid piezoelectric film 30X are arranged in the desired pattern.

Since the portions 35 of the solid piezoelectric film 30X containing the pyrochlore phase have a number of microcracks and are fragile, the portions 35 can be easily removed by wet or dry etching or the like. The present inventors have confirmed that a liquid etchant permeates into the microcracks in the portions 35 containing the pyrochlore phase, and therefore the portions 35 can be easily removed by wet etching.

In the case where the solid piezoelectric film 30X has a columnar-structure constituted by a great number of columnar grains which extend nonparallel to the surface of the lower electrode 20, it is easy to mechanically separate adjacent columnar grains from each other. Therefore, in the sixth step, the unnecessary portions 35 of the solid piezoelectric film 30X can be satisfactorily separated from the necessary portions 34 of the solid piezoelectric film 30X at the boundaries between the unnecessary portions 35 and the necessary portions 34. That is, it is possible to easily and precisely remove only the unnecessary portions 35, and suppress defective patterning such as loss of part of the pattern.

In the above case, the unnecessary portions 35 of the solid piezoelectric film 30X are separated from the necessary portions 34 of the solid piezoelectric film 30X at the boundaries between the columnar grains. Therefore, the side faces 31a of the one or more protruding portions 31 are constituted by boundary faces of part of the columnar grains, and thus the side faces 31a of the one or more protruding portions 31 become parallel to the directions of the growth of the columnar grains. In the case where the columnar grains are grown approximately perpendicular to the surface of the lower electrode 20, it is possible to stably make the side faces 31a of the one or more protruding portions 31 approximately perpendicular to the surface of the lower electrode 20.

The process according to present embodiment has the advantages that defective patterning such as loss of part of the pattern can be effectively suppressed, and the piezoelectric film 30 can be stably produced so that the inclinations of the side faces 31a of the one or more protruding portions 31 vary little with the protruding portions 31, the side faces 31a have satisfactory smoothness, and the one or more protruding portions 31 are precisely shaped. The above advantages can be achieved regardlessly of the composition or the thickness of the piezoelectric film 30.

2.7 Seventh Step

Figure 2F:
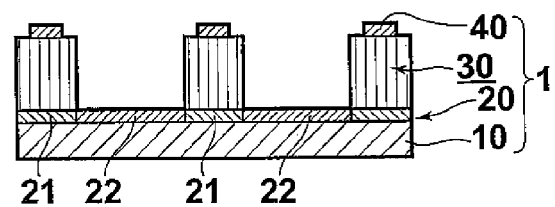

In the seventh (final) step of the process, the upper electrodes 40 are formed on the one or more protruding portions 31 as illustrated in FIG. 2F. Further, when necessary, the thickness of the substrate 10 may be reduced by etching of the bottom surface of the substrate 10. Thus, production of the piezoelectric device 1 is completed.

2.8 Production of Inkjet Recording Head

The inkjet recording head 3 can be produced by attaching the diaphragm 50 and the ink-nozzle member 60 to the piezoelectric device 1 as illustrated in FIG. 1. Alternatively, the diaphragm 50 and the ink-nozzle member 60 including the ink chambers 61 may be produced by processing the substrate 10 per se as explained before.

2.9 Advantages of the Process

The process according to the present embodiment further has the following advantages.

As explained before, the piezoelectric film 30 is produced by forming the solid piezoelectric film 30X on the lower electrode 20 the surface of which includes the one or more lowly-surface-oxidized areas 21 and the one or more highly-surface-oxidized areas 22, and patterning the solid piezoelectric film 30X. According to the present embodiment, it is possible to form the solid piezoelectric film 30X so that the crystal structure of the portions 35 of the solid piezoelectric film 30X located on the one or more highly-surface-oxidized areas 22 is different from the crystal structure of the portions 34 of the solid piezoelectric film 30X located on the one or more lowly-surface-oxidized areas 21. Therefore, it is easy to selectively remove the portions 35 of the solid piezoelectric film 30X located on the one or more highly-surface-oxidized areas 22. In addition, it is possible to separate the solid piezoelectric film 30X into the portions 35 of the solid piezoelectric film 30X located on the one or more highly-surface-oxidized areas 22 and the portions 34 of the solid piezoelectric film 30X located on the one or more lowly-surface-oxidized areas 21 (at the boundaries between the portions 35 and the portions 34), and selectively and precisely leave only the portions 34 of the solid piezoelectric film 30X located on the one or more lowly-surface-oxidized areas 21 so that the portions 34 of the solid piezoelectric film 30X are arranged in the desired pattern. Further, it is possible to make the side faces 31a of the one or more protruding portions 31 perpendicular to the surface of the lower electrode 20. Furthermore, according to the present embodiment, the solid piezoelectric film 30X can be precisely shaped by the patterning. Moreover, since the solid piezoelectric film 30X is easy to pattern, the solid piezoelectric film 30X can be patterned at low cost.

In the process according to the present embodiment, the patterning of the piezoelectric film 30 can be performed without dry etching. Even in the case where the piezoelectric film 30 has a great thickness on the order of micrometers, the piezoelectric film 30 can be patterned in a shorter time than the conventional piezoelectric films which are patterned by using the dry etching. Further, since the process according to the present embodiment does not require a high-vacuum process as the dry etching does, the process according to the present embodiment can be performed at low cost compared with the conventional patterning.

2.10 Variations of the Process (1) It is also possible to use dry etching for removal of the portions 35 of the solid piezoelectric film 30X located on the one or more highly-surface-oxidized areas 22. Even in this case, the etching of the portions 35 is far easier than the dry etching of the conventional piezoelectric films, since the portions 35 of the solid piezoelectric film 30X are fragile.

(2) Although the surface of the lower electrode 20 includes the one or more lowly-surface-oxidized areas 21 and the one or more highly-surface-oxidized areas 22 which are surface oxidized to two different degrees in the process according to the present embodiment, alternatively, it is possible to form the lower electrode 20 so that the surface of the lower electrode 20 has areas which are surface oxidized to three or more different degrees. Even in this case, it is possible to form a solid piezoelectric film 30X constituted by portions having different crystal structures according to the degrees of the surface oxidation of the areas on which the respective portions of the solid piezoelectric film 30X are formed.

2.11 Applications of the Process (1) The patterning technique used in the process according to the present invention can be used in patterning of arbitrary inorganic films. In particular, the process according to the present invention can be preferably applied to patterning of inorganic films being formed of a material which is difficult to etch and having a greater thickness than the electrodes and the like (which have thicknesses on the order of nanometers).

(2) The patterning technique used in the process according to the present invention can be preferably applied to patterning of an inorganic film which can be formed so as to have a columnar-grain structure constituted by columnar grains. The nonpiezoelectric materials of which an inorganic film having a columnar-grain structure can be formed include dielectric materials, metals, and the like. The dielectric materials include oxides such as $ZrO_2$, $ZnO$, $Al_2O_3$, and $TiC_2$, nitrides such as $AlN$, $Si_3N_4$, and $TiN$, and carbides such as $SiC$ and $B_4C$, and the metals include Al, Cu, Ta, Ti, and the like. Further, the inorganic film having a columnar-grain structure can be formed of combinations of the above nonpiezoelectric materials.

3. Inkjet Recording Apparatus

Figure 3:
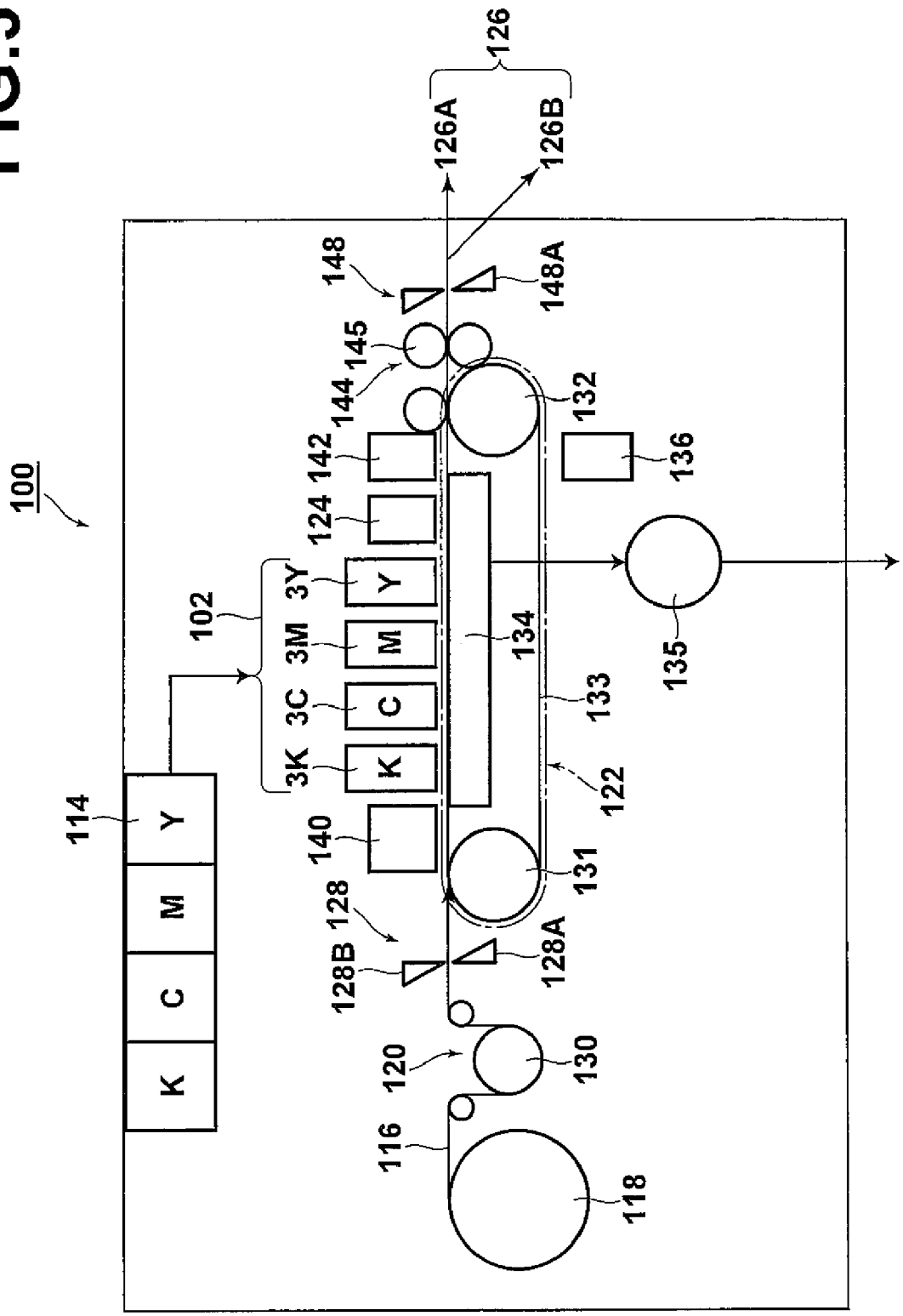
FIG. 3 is a schematic diagram of an example of an inkjet recording apparatus using the inkjet recording head of FIG. 1.
Figure 4:
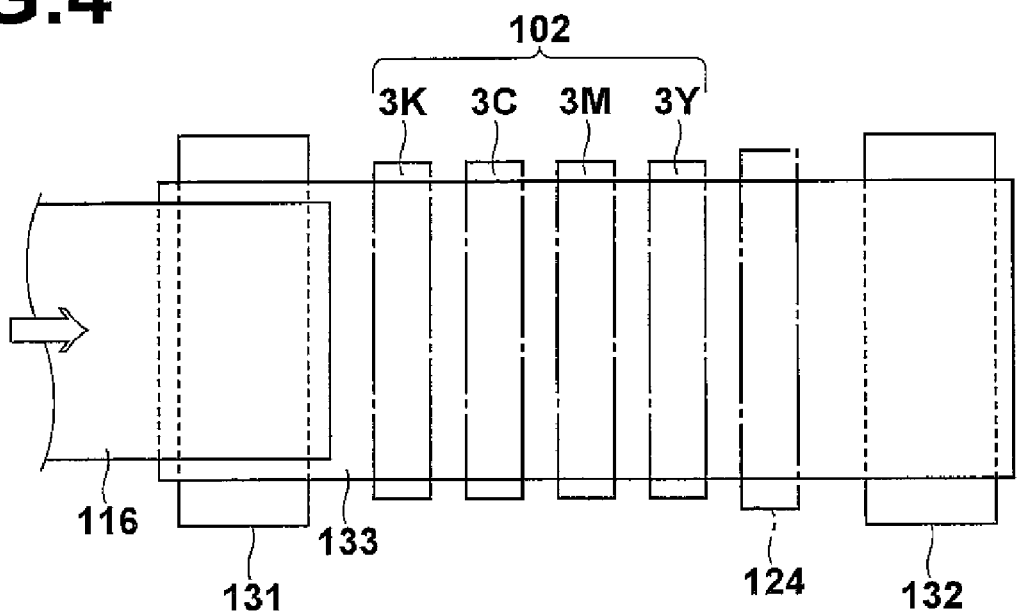
FIG. 4 is a top view of a portion of the inkjet recording apparatus of FIG. 3.

Hereinbelow, an example of an inkjet recording apparatus having the inkjet recording head 3 is explained with reference to FIGS. 3 and 4. FIG. 3 is a schematic diagram illustrating an outline of an example of an inkjet recording apparatus having the inkjet recording head 3 of FIG. 1, and FIG. 4 is a top view of a portion of the inkjet recording apparatus of FIG. 3.

As schematically illustrated in FIG. 3, the inkjet recording apparatus 100 comprises a printing unit 102, an ink reserve-and-load unit 114, a sheet feeding unit 118, a decurling unit 120, a suction-type belt conveyer 122, a print detection unit 124, and a sheet output unit 126. The printing unit 102 comprises a plurality of inkjet recording heads 3K, 3C, 3M, and 3Y corresponding to inks of different colors (specifically, black (K), cyan (C), magenta (M), and yellow (Y)). Hereinafter, the inkjet recording heads may be referred to as heads. The ink reserve-and-load unit 114 reserves the inks to be supplied to the heads 3K, 3C, 3M, and 3Y. The sheet feeding unit 118 feeds a recording sheet 116. The decurling unit 120 eliminates curl of the recording sheet 116. The suction-type belt conveyer 122 is arranged to face the nozzle faces (ink-discharge faces) of the printing unit 102, and conveys the recording sheet 116 while maintaining the flatness of the recording sheet 116. The print detection unit 124 reads an image printed on the recording sheet 116 by the printing unit 102. The sheet output unit 126 externally outputs a printed recording sheet 116.

Each of the heads 3K, 3C, 3M, and 3Y constituting the printing unit 102 corresponds to the inkjet recording head 3 according to the present embodiment as explained before. In order to realize a linear head (explained later), each inkjet recording head used in the inkjet recording apparatus 100 comprises a plurality of ink chambers and a plurality of ink-discharge outlets.

The decurling unit 120 performs decurling of the recording sheet 116 by heating the recording sheet 116 with a heating drum 130 so as to eliminate the curl produced in the sheet feeding unit 118.

In the case where the inkjet recording apparatus 100 uses roll paper, a cutter 128 for cutting the roll paper into desired size is arranged in the stage following the decurling unit 120 as illustrated in FIG. 3. The cutter 128 is constituted by a fixed blade 128A and a round blade 128B. The fixed blade 128A has a length equal to or greater than the width of the conveying path of the recording sheet 116, and is arranged on the side opposite to the print side of the recording sheet 116. The round blade 128B is arranged opposite to the fixed blade 128A on the print side of the recording sheet 116, and moves along the fixed blade 128A. In the inkjet recording apparatuses using cut paper, the cutter 128 is unnecessary.

After the roll paper is decurled and cut into the recording sheet 116, the recording sheet 116 is transferred to the suction-type belt conveyer 122. The suction-type belt conveyer 122 is constituted by rollers 131 and 132 and an endless belt 133. The rollers 131 and 132 are placed apart and the endless belt 133 is looped around the rollers 131 and 132 in such a manner that at least portions of the endless belt 133 which face the nozzle faces of the printing unit 102 and the sensor face of the print detection unit 124 are flat and horizontal.

The endless belt 133 has a width greater than the width of the recording sheet 116, and a great number of suction pores (not shown) are formed through the endless belt 133. A suction chamber 134 is arranged inside the loop of the endless belt 133 at the position opposite to the nozzle faces of the printing unit 102 and the sensor face of the print detection unit 124, and suctioned by a fan 135, so that a negative pressure is generated in the suction chamber 134, and the recording sheet 116 on the endless belt 133 is held by suction.

The power of a motor (not shown) is transmitted to at least one of the rollers 131 and 132 so that the endless belt 133 is driven clockwise in FIG. 3, and the recording sheet 116 held on the endless belt 133 is moved from left to right in FIG. 3.

In the case of borderless printing, ink can be deposited on the endless belt 133. Therefore, in order to clean the endless belt 133, a belt cleaning unit 136 is arranged at a predetermined (appropriate) position outside the loop of the endless belt 133 and the printing region.

A heating fan 140 is arranged on the upstream side of the printing unit 102 above the conveying path of the recording sheet 116 (which is realized by the suction-type belt conveyer 122). The heating fan 140 blows heated air to the recording sheet 116 before printing so as to heat the recording sheet 116 and facilitate drying of deposited ink.

Each of the heads 3K, 3C, 3M, and 3Y in the printing unit 102 is a so-called full-line type head, which is a linear head having a length corresponding to the maximum width of the recording sheet 116, and being arranged across the width of the recording sheet 116 (i.e., in the main scanning direction perpendicular to the feeding direction of the recording sheet 116) as illustrated in FIG. 4. Specifically, each of the heads 3K, 3C, 3M, and 3Y is a linear head in which the aforementioned plurality of ink-discharge outlets (nozzles) are arrayed over a length exceeding the maximum length of a side of the largest recording sheet 116 on which the inkjet recording apparatus 100 can print an image. The heads 3K, 3C, 3M, and 3Y corresponding to the inks of the different colors are arrayed upstream in this order along the feeding direction as illustrated in FIG. 4. Thus, a color image can be printed on the recording sheet 116 by discharging the inks of the different colors while conveying the recording sheet 116.

The print detection unit 124 may be constituted by, for example, a line sensor which takes an image formed of spots of the inks discharged from the printing unit 102, and detects, from the image taken by the line sensor, incomplete discharge, which can be caused by clogging of a nozzle or the like.

A rear drying unit 142 for drying the printed surface of the recording sheet 116 is arranged in the stage following the print detection unit 124. For example, the rear drying unit 142 is realized by a heating fan or the like. Since it is preferable to avoid contact with the printed surface before the ink on the printed surface is completely dried, it is preferable that the rear drying unit 142 dry the ink on the printed surface by blowing heated air.

In order to control the glossiness of the image printed on the recording sheet 116, a heating-and-pressurizing unit 144 is arranged in the stage following the rear drying unit 142. The heating-and-pressing unit 144 comprises a pressure roller 145 having a surface having predetermined projections and depressions, and transfers the predetermined projections and depressions to the printed surface of the recording sheet 116 by pressing the printed surface with the pressure roller 145 while heating the printed surface.

Finally, the printed recording sheet 116 produced as above is outputted from the sheet output unit 126. It is preferable to separately output test prints and prints for practical use. Therefore, the sheet output unit 126 includes a first output unit 126A for the prints for practical use and a second output unit 126B for the test prints. Although not shown, the inkjet recording apparatus 100 further comprises a sorting unit which sorts the printed recording sheets 116 into the test prints and the prints for practical use, and sends the test prints to the first output unit 126B, and the prints for practical use to the second output unit 126A.

Further, in the case where both of a test image and an image for practical use are concurrently printed on a recording sheet 116, it is possible to arrange a cutter 148, and separate a first portion of the recording sheet 116 on which the test image is printed and a second portion of the recording sheet 116 on which the image for practical use is printed.

4. Evaluation of Examples

The present inventors have produced a concrete example of a piezoelectric device according to the present invention and comparison examples 1 to 4 of a piezoelectric device as indicated below.

4.1 Concrete Example

The concrete example of the piezoelectric device according to the present invention has been produced as follows.

In the first stage of the process of producing the concrete example of the piezoelectric device, a substrate having an electrode has been produced by forming on a substrate of silicon (Si) an adhesion layer of titanium (Ti) having a thickness of 10 nm and a lower electrode of iridium (Ir) having a thickness of 250 mm in this order. Then, a dot pattern of resist having a thickness of 10 micrometers has been formed on the Ir lower electrode. The resist is the type AZ9245 available from Clariant Japan K.K., where the dot pattern includes dots with a diameter of 200 micrometers and dots with a diameter of 100 micrometers. Subsequently, oxygen plasma ashing has been performed on the substrate having the above dot pattern with the RF power of 150 W and the 02 concentration of 100% for 10 minutes. Thereafter, the substrate processed as above has been soaked in acetone so as to dissolve the resist.

In addition to the above substrate, a specimen for analysis of the lower electrode has also been produced by performing the same operations as above. Then, the composition of the surface of the lower electrode has been analyzed by ESCA (Electron Spectroscopy for Chemical Analysis), where the surface of the electrode includes the areas which have been masked with the resist during the oxygen plasma ashing and the areas which have not been masked with the resist during the oxygen plasma ashing.

Figure 5A:
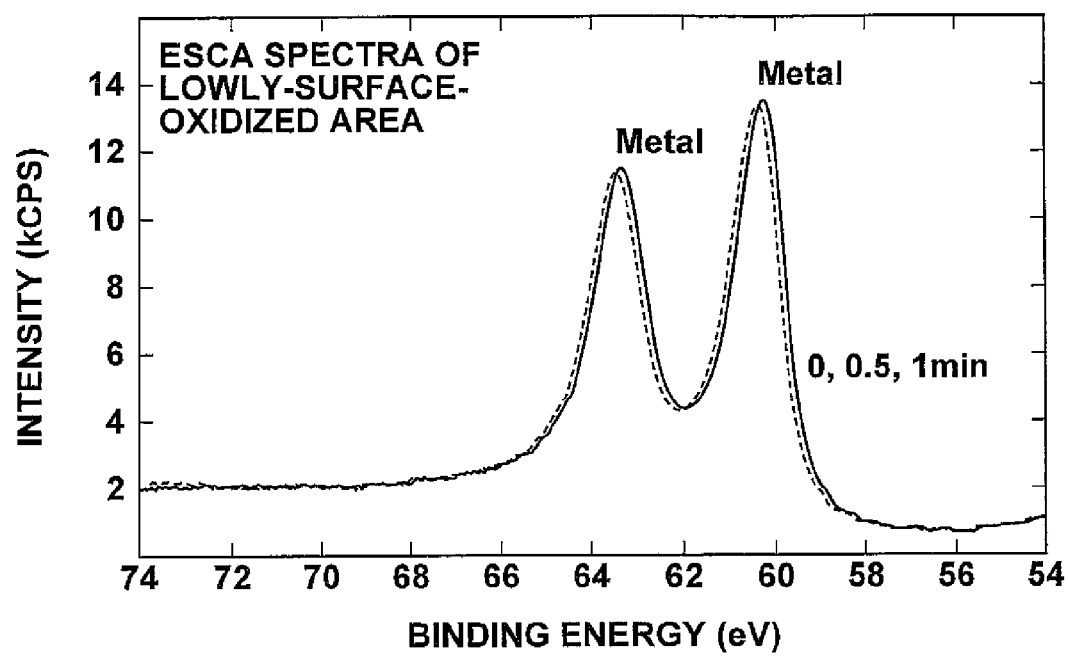
FIG. 5A indicates ESCA spectra of a lowly-surface-oxidized area of a lower electrode in a concrete example.
Figure 5B:
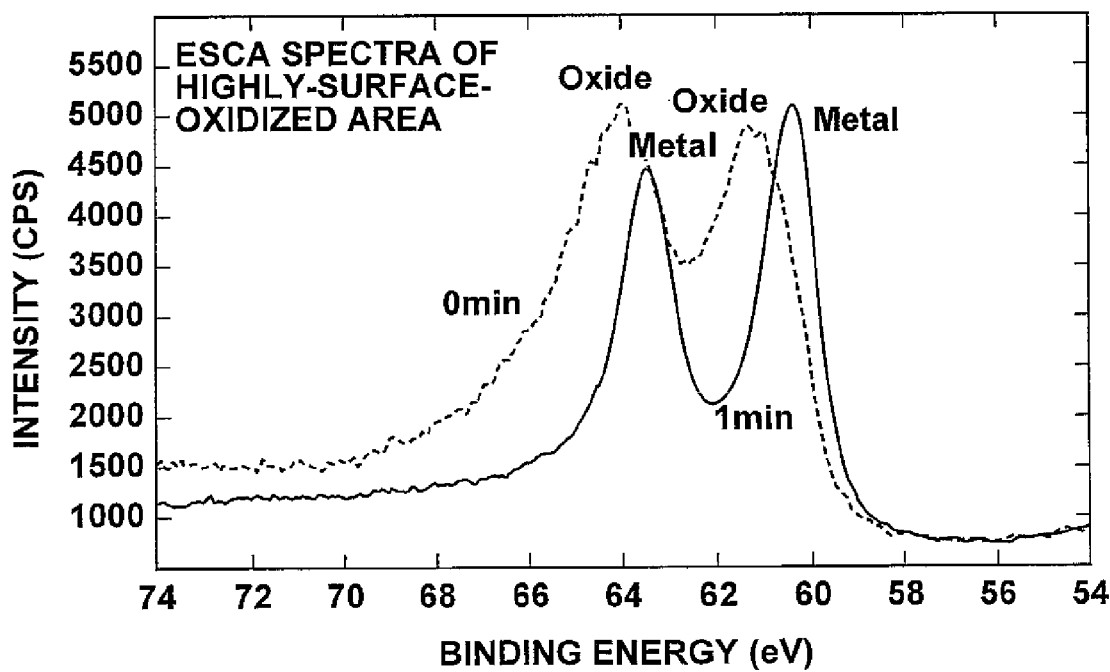
FIG. 5B indicates ESCA spectra of a highly-surface-oxidized area of the lower electrode in the concrete example.

FIG. 5A indicates ESCA spectra of a first area of the lower electrode in the concrete example which has been masked with the resist during the oxygen plasma ashing, and FIG. 5B indicates ESCA spectra of a second area of the lower electrode in the concrete example which has not been masked with the resist during the oxygen plasma ashing. In FIGS. 5A and 5B, the times indicated in minutes are the sputtering times for exposing portions located in various depths from the surface of the specimen.

As indicated in FIG. 5A, only the peaks of metal iridium (Ir) have been detected in the ESCA spectra of the first area (which has been masked with the resist during the oxygen plasma ashing). That is, it has been confirmed that the first area is unoxidized, and realizes a lowly-surface-oxidized area 21. On the other hand, as indicated in FIG. 5B, the peaks of an oxide of iridium have been detected in the ESCA spectrum of the unsputtered surface of the second area (which has not been masked with the resist during the oxygen plasma ashing). In FIG. 5B, the ESCA spectrum of the unsputtered surface bears the indication of the sputtering time "0 min." That is, it has been confirmed that the second area is surface oxidized, and realizes a highly-surface-oxidized area 22. In addition, peak fitting has been performed in the ESCA spectrum of the second area (which has not been masked with the resist during the oxygen plasma ashing), and the peak area ratio of the oxide of iridium to the metal iridium has been obtained as approximately 2.5.

After the formation and selective surface oxidation of the lower electrode in the first stage as explained before, in the second stage of the process of producing the concrete example, a solid piezoelectric film of PZT having a thickness of 4 micrometers has been formed on the selectively-surface-oxidized lower electrode in the atmosphere of the mixture of Ar and 2.5 volume percent 02 at the pressure of $3\times10^{-5}$ Pa at 450° C. by using a sputtering system and a target of $Pb_{1.3}Zr_{0.52}Ti_{0.48}O_3$.

Figure 6A:
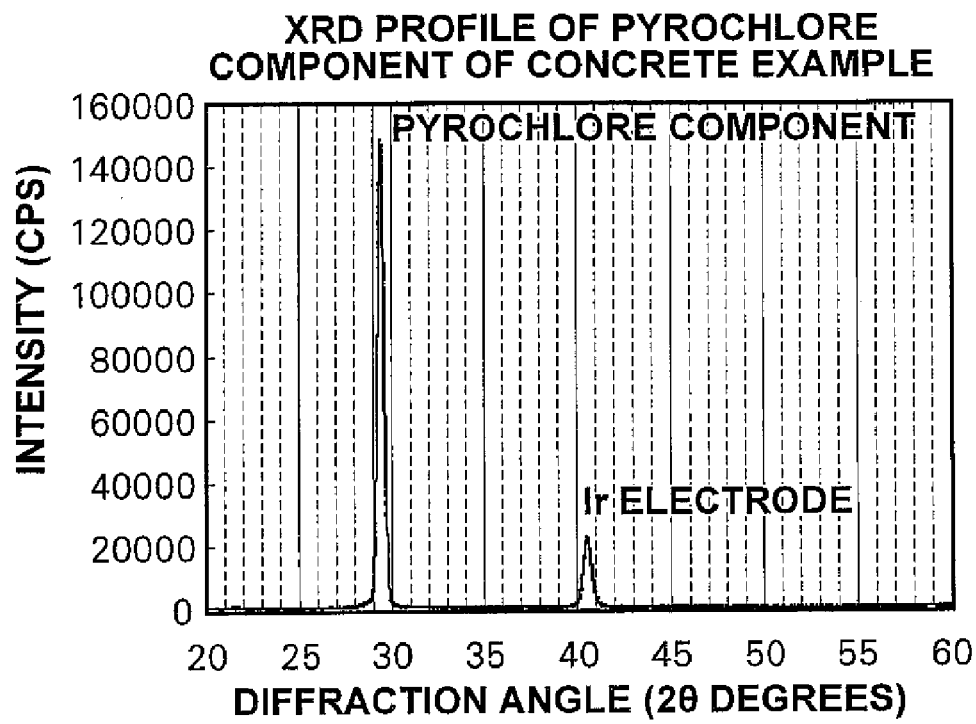
FIG. 6A is an XRD profile of a portion of a piezoelectric film containing a pyrochlore phase in the concrete example before patterning.
Figure 6B:
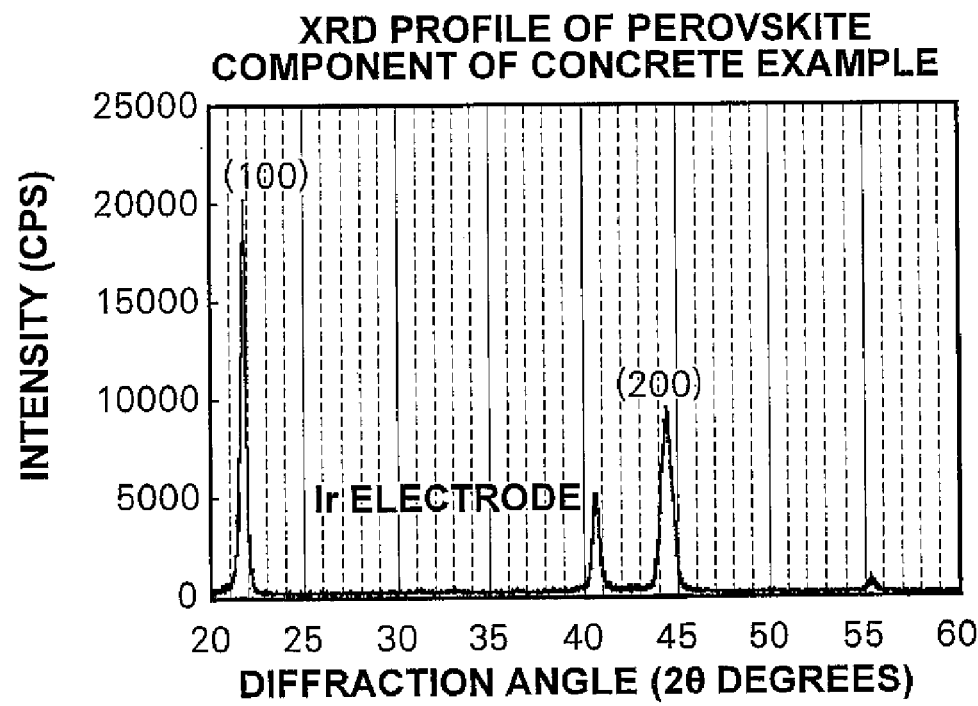
FIG. 6B is an XRD profile of a portion of the piezoelectric film having a perovskite structure in the concrete example before patterning.

Thereafter, X-ray-diffraction (XRD) measurement of the above solid piezoelectric film has been performed. The results of the XRD measurement are indicated in FIGS. 6A and 6B. FIG. 6A shows an XRD profile of a portion of the solid piezoelectric film located on a highly-surface-oxidized area of the lower electrode in the concrete example before patterning, and FIG. 6B shows an XRD profile of a portion of the solid piezoelectric film located on a lowly-surface-oxidized area of the lower electrode in the concrete example before patterning. FIG. GA shows that the portion of the solid piezoelectric film located on the highly-surface-oxidized area of the lower electrode contains a pyrochlore phase, and FIG. GB shows that the portion of the solid piezoelectric film located on the lowly-surface-oxidized area has a (100)-oriented perovskite crystal structure. The ratio of the XRD peak intensity of the pyrochlore component to the sum of the XRD peak intensities of the pyrochlore and perovskite components in the XRD profile of the portion of the solid piezoelectric film located on the highly-surface-oxidized area of the lower electrode (i.e., the proportion of the pyrochlore component in the solid piezoelectric film located on the highly-surface-oxidized area of the lower electrode based on the XRD peak intensities of the pyrochlore and perovskite components) has been obtained as 100%. On the other hand, the ratio of the XRD peak intensity of the pyrochlore component to the sum of the XRD peak intensities of the pyrochlore and perovskite components in the XRD profile of the portion of the solid piezoelectric film located on the lowly-surface-oxidized area of the lower electrode (i.e., the proportion of the pyrochlore component in the solid piezoelectric film located on the lowly-surface-oxidized area of the lower electrode based on the XRD peak intensities of the pyrochlore and perovskite components) has been obtained as 0%.

FIG. 7 shows a relationship between the ESCA peak area ratio of the oxide of iridium to the metal iridium in the lower electrode and the ratio of the XRD peak intensity of the pyrochlore component to the sum of the XRD peak intensities of the pyrochlore and perovskite components in PZT grown on the lower electrode (i.e., the proportion of the pyrochlore component in PZT grown on the lower electrode based on the XRD peak intensities of the pyrochlore and perovskite components). In FIG. 7, the point at which both of the ESCA peak area ratio and the ratio of the XRD peak intensity of the pyrochlore component are zero indicates the data obtained from the lowly-surface-oxidized area in the concrete example explained above, and the point at which the ESCA peak area ratio is approximately 2.5 and the ratio of the XRD peak intensity of the pyrochlore component is 100% indicates the data obtained from the highly-surface-oxidized area in the concrete example.

The surface of the solid piezoelectric film in the concrete example has been observed by an optical microscope. FIG. 8 is an optical micrograph of the surface of the solid piezoelectric film in the concrete example before patterning. A number of microcracks have been observed in the regions containing the pyrochlore phase. The regions having the pyrochlore phase are considered to be fragile.

Next, in the third stage of the process of producing the concrete example, the portions of the solid piezoelectric film having the (100)-oriented perovskite crystal structure have been protected by masking with the resist of the type AZ9245 (available from Clariant Japan K.K.), and the solid piezoelectric film has been soaked in a 0.9% solution of a buffered oxide etchant (BOE) containing 6% HCl (i.e., a solution containing a 6:1 mixture of HCl and BOE), so that only the portions of the solid piezoelectric film containing the pyrochlore phase have been etched off, and a pattern of PZT having the (100)-oriented perovskite crystal structure has been obtained. A cross section of the pattern has been observed by SEM (scanning electron microscope), and formation of a satisfactory dot pattern including the dots with the diameter of 200 micrometers and the dots with the diameter of 100 micrometers has been confirmed, and the side faces of the protruding portions of the piezoelectric film have been observed to be approximately perpendicular to the surface of the lower electrode. In addition, the piezoelectric film has been observed to have a columnar structure constituted by a great number of columnar grains which extend nonparallel to the surface of the substrate, and the side faces of the protruding portions of the piezoelectric film have been observed to be constituted by boundary faces of part of the columnar grains.

Further, the piezoelectric constant $d_{31}$ of the piezoelectric film has been measured by using the cantilever technique, and the obtained piezoelectric constant $d_{31}$ is as high as 250 pm/V. That is, the piezoelectric performance of the piezoelectric film as the concrete example has been found to be satisfactory.

In the final stage of the process of producing the concrete example, an adhesion layer of titanium (Ti) having a thickness of 10 nm and an upper electrode of platinum (Pt) having a thickness of 200 nm have been formed on the dot pattern of the piezoelectric film by sputtering. Thus, the production of the piezoelectric device as the concrete example has been completed.

4.2 Comparison Examples 1 and 2

The comparison examples 1 and 2 of the piezoelectric device have been produced in similar manners to the above concrete example except that the oxygen plasma ashing of the lower electrode has been performed for 3 minutes in the comparison example 1 and for 5 minutes in the comparison example 2.

The composition of the surface of the lower electrode in each of the comparison examples 1 and 2 has been analyzed by ESCA (Electron Spectroscopy for Chemical Analysis), where the surface of the electrode includes areas which have been masked with the resist during the oxygen plasma ashing and areas which have not been masked with the resist during the oxygen plasma ashing. In addition, the peak area ratio of the oxide of iridium to the metal iridium has been obtained for each of the comparison examples 1 and 2 by performing peak fitting in the spectrum of the surface-oxidized area (which has not been masked with the resist during the oxygen plasma ashing), and found to be less than 2.0 in each of the comparison examples 1 and 2. That is, the surface oxidation of the surface-oxidized area of the surface of the lower electrode in each of the comparison examples 1 and 2 has been found to be insufficient.

Thereafter, in each of the comparison examples 1 and 2, a solid piezoelectric film of PZT having a thickness of 4 micrometers has been formed in a similar manner to the concrete example on the lower electrode which has been selectively surface oxidized as explained above. Then, XRD measurement of the solid piezoelectric film has been performed as in the concrete example. In each of the comparison examples 1 and 2, it has been observed that the peak of the pyrochlore phase in the portion of PZT grown on the surface-oxidized area (which has undergone the oxygen plasma ashing) is small, the portion of PZT having the perovskite structure has also grown even on the surface-oxidized area, and the ratio of the XRD peak intensity of the pyrochlore component to the sum of the XRD peak intensities of the pyrochlore and perovskite components (i.e., the proportion of the pyrochlore component based on the XRD peak intensities of the pyrochlore and perovskite components) in the portion of PZT grown on the surface-oxidized area has been found to be less than 10%. FIG. 7 also shows the values of the ESCA peak area ratio of the oxide of iridium to the metal iridium in the surface-oxidized area of the lower electrode in each of the comparison examples 1 and 2 and the ratio of the XRD peak intensity of the pyrochlore component to the sum of the XRD peak intensities of the pyrochlore and perovskite components (i.e., the proportion of the pyrochlore component based on the XRD peak intensities of the pyrochlore and perovskite components) in the portion of the solid piezoelectric film grown on the surface-oxidized area in each of the comparison examples 1 and 2.

Further, etching of the portions of the solid piezoelectric film grown on the surface-oxidized areas in each of the comparison examples 1 and 2 has been performed in a similar manner to the concrete example. However, the result of the etching indicates that the portions of the solid piezoelectric film grown on the surface-oxidized areas cannot be completely removed by the etching.

Consequently, the results of the investigation of the comparison examples 1 and 2 indicate that the surface-oxidized areas of the lower electrode (on which the portions of the solid piezoelectric film of PZT which are to be removed by etching are formed) should be surface oxidized so that the ESCA peak area ratio of the oxide of iridium to the metal iridium in the surface-oxidized areas exceeds 2.0.

4.3 Comparison Example 3

The comparison example 3 of the piezoelectric device has been produced in a similar manner to the concrete example except that the oxygen plasma ashing of the lower electrode is not performed after the formation of the dot pattern of resist on the lower electrode.

In the comparison example 3, processing for formation of a solid piezoelectric film of PZT having a thickness of 4 micrometers has been performed under a similar film-formation condition to the concrete example (which enables growth of the columnar-grain structure), after the formation of the dot pattern of resist on the lower electrode. In the processing, the resist in the dot pattern has been oxidized due to high temperature, so that growth of PZT on the resist have not been observed. In addition, even in the portions of the solid piezoelectric film formed on the areas which have not been masked with the resist during the processing for formation of the solid piezoelectric film, formation of a fragile film containing 70% or more of the pyrochlore component has been observed. Consequently, formation of a PZT film having a satisfactory crystal structure has not been observed in the comparison example 3.

4.4 Comparison Example 4

The comparison example 4 of the piezoelectric device has been produced in a similar manner to the concrete example except that the oxygen plasma ashing of the lower electrode is not performed after the formation of the dot pattern of resist on the lower electrode, and processing for formation of a solid piezoelectric film is performed under such a condition as to form an amorphous structure instead of the columnar-grain structure.

Specifically, in the comparison example 4, processing for formation of a solid piezoelectric film of PZT having a thickness of 4 micrometers is performed in the atmosphere of the mixture of Ar and 2.5 volume percent $O_2$ at the pressure of $3\times10^{-5}$ Pa at room temperature. This is a condition for growing an amorphous structure.

Thereafter, the piezoelectric film is patterned by the lift-off technique. Specifically, the substrate on which the solid piezoelectric film of PZT is formed as above is soaked in acetone so as to dissolve the resist. Then, the piezoelectric film is heated to 650° C. so as to crystallize the amorphous PZT. Then, a cross section of the pattern has been observed by SEM (scanning electron microscope), and occurrence of some pattern defects (in which some edges of the protruding portions are lost) has been detected.

Figure 9:
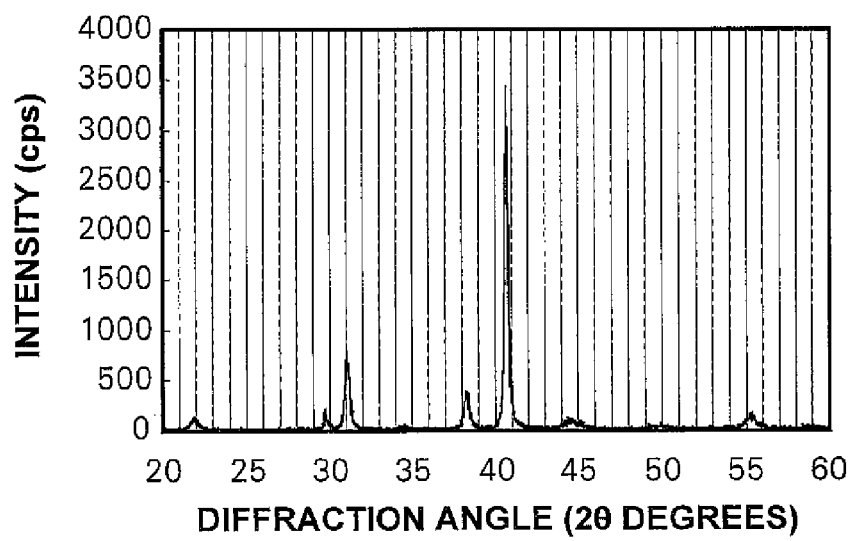
FIG. 9 is an XRD profile of a piezoelectric film in a comparison example 4.

In addition, XRD measurement of the solid piezoelectric film processed as above has been performed, and the solid piezoelectric film has been observed to be a randomly oriented film (having no crystal orientation). FIG. 9 shows an XRD profile of the piezoelectric film in the comparison example 4. Further, the piezoelectric constant $d_{31}$ of the piezoelectric film has been measured by using the cantilever technique, and the obtained piezoelectric constant $d_{31}$ is as low as 50 pm/V. That is, the piezoelectric performance of the piezoelectric film as the comparison example 4 has been found to be unsatisfactory.

5. Additional Matters

The present invention is preferable for use in patterning of an inorganic film into a predetermined patterned structure constituted by one or more protruding portions. The present invention is particularly preferable for use in patterning of the piezoelectric film and the like.

What is claimed is:

1. An inorganic film formed of an inorganic material on a metal film having a surface which includes a plurality of surface-oxidized areas, where the plurality of surface-oxidized areas are surface oxidized to a plurality of degrees, said inorganic film has a plurality of regions respectively formed on the plurality of surface-oxidized areas, and the plurality of regions have different crystal structures according to the different degrees.

2. An inorganic film according to claim 1, wherein said plurality of surface-oxidized areas are one or more lowly-surface-oxidized areas and one or more highly-surface-oxidized areas which are more highly surface oxidized than the one or more lowly-surface-oxidized areas, said inorganic material is a piezoelectric material, one or more of the plurality of regions which are formed on the one or more lowly-surface-oxidized areas have a perovskite structure, and one or more of the plurality of regions which are formed on the one or more highly-surface-oxidized areas contain a pyrochlore phase.

3. An inorganic film according to claim 2, wherein said piezoelectric material contains a lead-containing compound.

4. The inorganic film according to claim 2, wherein an ESCA peak area ratio of Ir oxide to Ir metal is greater than 2.0 in the highly-surface-oxidized areas, and an ESCA peak area ratio of Ir oxide to Ir metal is less than 2.0 in the lowly-surface-oxidized areas.

5. An inorganic film according to claim 1, wherein said metal film contains noble metal as a main component.

6. An inorganic film according to claim 1, having a columnar-grain structure constituted by a plurality of columnar grains each extending nonparallel to said surface.

7. The inorganic film according to claim 1, wherein the main component of said metal film is selected from the group consisting of Au, Pt, and Ir.

* * * * *